United States Patent [19]
Murray et al.

[11] 4,213,665
[45] Jul. 22, 1980

[54] ELECTRICAL CONNECTOR

[75] Inventors: Ronald A. Murray, Methuen; Gary P. Piccirillo, Worcester, both of Mass.

[73] Assignee: TRW Inc., Cleveland, Ohio

[21] Appl. No.: 28,465

[22] Filed: Apr. 9, 1979

[51] Int. Cl.$^2$ .......................... H05K 1/18; G09F 9/00
[52] U.S. Cl. .............................. 339/17 D; 339/17 F; 340/381; 362/306; 362/375
[58] Field of Search ........... 339/17 D, 17 F, 176 MF, 339/176 L; 362/61, 62, 77, 154, 227, 249, 367, 306, 374, 375; 361/398, 401; 340/381

[56] References Cited
U.S. PATENT DOCUMENTS

| | | | |
|---|---|---|---|
| 2,975,271 | 3/1961 | Dvorak | 362/374 |
| 3,354,454 | 11/1967 | Rueger | 340/381 |
| 3,544,950 | 11/1968 | Lopez et al. | 339/17 D |
| 3,843,951 | 10/1974 | Maheux | 339/17 F |

FOREIGN PATENT DOCUMENTS 2532854 10/1977 Fed. Rep. of Germany ........... 362/306

Primary Examiner—Neil Abrams
Attorney, Agent, or Firm—James R. O'Connor; Thomas C. O'Konski; John F. McKenna

[57] ABSTRACT

An electrical connector includes a housing composed of two hinged-together housing sections molded of plastic as a single unitary part. One housing section defines a pair of spaced-apart resilient walls with a slot between them and a series of connector locations spaced along the slot. The other housing section defines a series of compartments which are in register with the connector locations when the two housing sections are superimposed. A flexible printed circuit is folded into the slot, the circuit having pairs of conductive paths positioned in the slot at each said connector location, which paths extend out of the slot so that electrical connections can be made to provide electrical power to bulbs removably retained at said connector locations and in electrical contact with the path pairs at said locations. The front wall of the housing cover section constitutes a light transmitting lens so that, when a bulb in a given compartment is energized, it illuminates that compartment to the exclusion of the others so as to make visible only the legend inscribed on the lens in register with that compartment.

23 Claims, 9 Drawing Figures

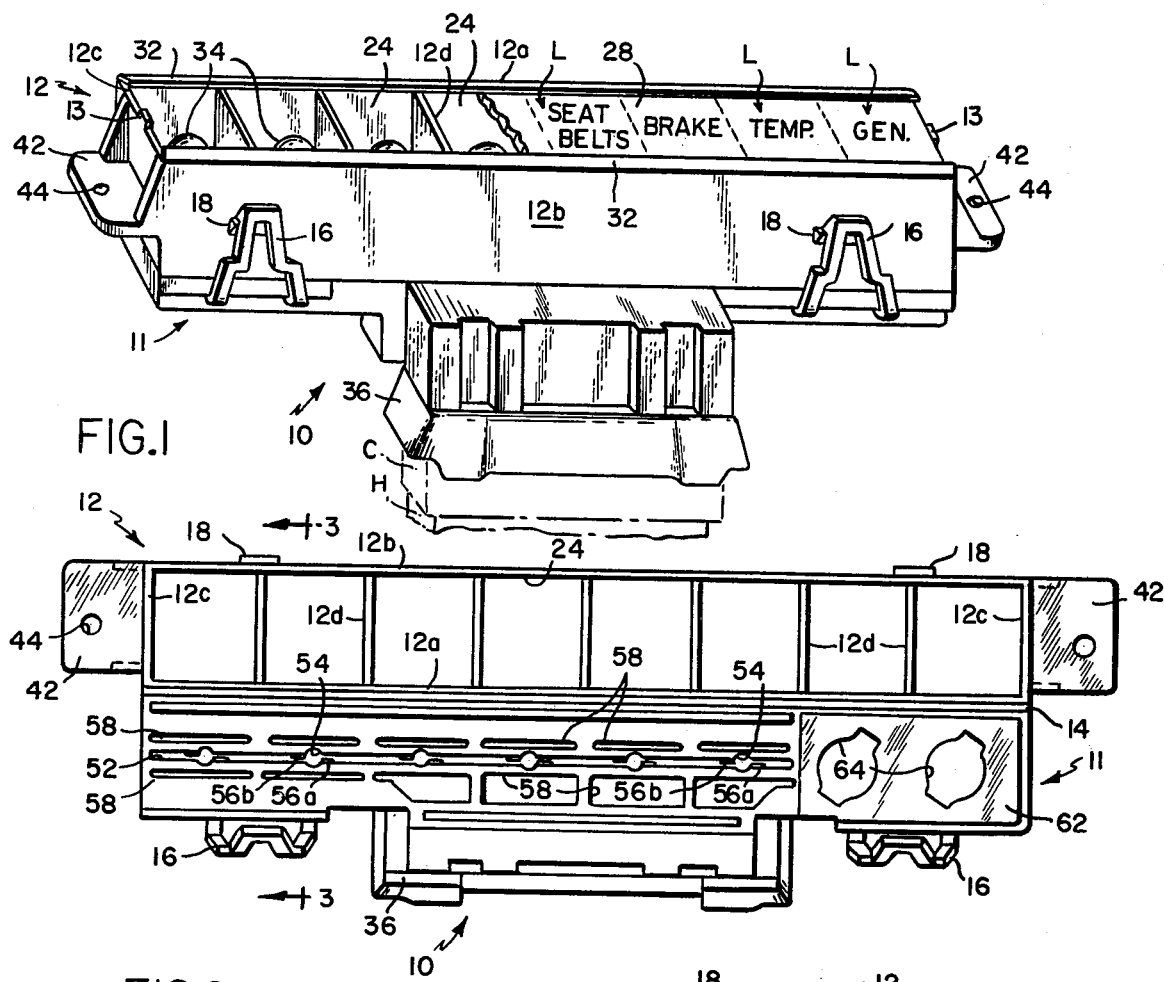
FIG.1
FIG.2
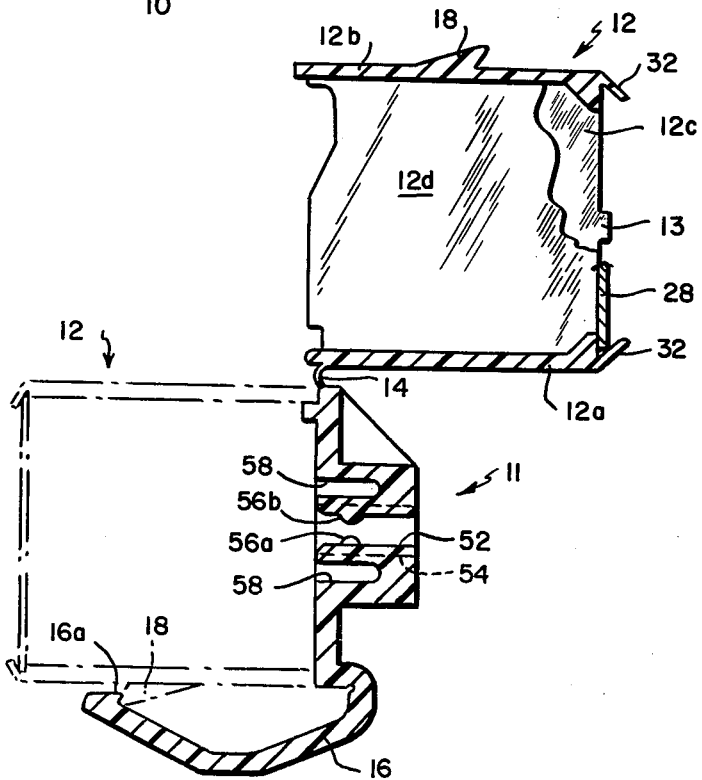
FIG.3

ELECTRICAL CONNECTOR

This invention relates to a socketless electrical connector. It relates more particularly to a connector of this type incorporated into a low-cost function display panel for an automobile.

BACKGROUND OF THE INVENTION

Most automobiles are equipped with a display panel usually mounted in or under the dashboard. The display panel includes a number of legends or signs which can be illuminated to provide warning signals or to indicate whether various functions have been performed by the car operator. Such panels may include, for example, the legends TEMP. and GEN. to indicate when the automobile radiator temperature is excessive and when the generator is not charging properly. The panel might also include a SEATBELTS legend which remains illuminated until the occupants of the car properly fasten their safety belts. There is usually a BRAKE legend which is illuminated to remind the car operator to disengage the safety brake before he puts the car in gear. Thus a given panel comprises several lamps which must be capable of being energized separately in order to illuminate the various legends in the panel independently of the others.

Usually a display panel of this type comprises a row of compartments, one wall of which faces the interior of the car, is translucent and carries the various legends. There is a small bulb positioned in each compartment which, when energized, illuminates the compartment so that a particular legend becomes visible to the driver. Thus each panel requires multiple electrical connections between the automobile's electrical system and the various bulbs in the display panel. Furthermore, those connections must be such as to permit the bulbs to be replaced in the event that they become defective. Heretofore, the bulbs have been retained in conductive sockets mounted in the display panel. Various types of sockets have been employed in the past. These include threaded sockets, bayonet sockets wherein the bulb is pressed into the socket and turned through a small angle so that it is retained in place. Other bulb connectors utilize various clips or springs to retain the bulb in place while at the same time making the required pair of electrical connections to the bulb.

While all of these prior connectors perform those required functions adequately, they are relatively expensive to manufacture because they require a relatively large amount of expensive electrically conductive metal such as copper or brass in the form of stampings to retain the bulbs. Also in many cases they are composed of several different parts which must be fabricated separately and then assembled. Each of those sockets must then be mounted in the particular panel structure, thereby further increasing the cost of the panel as a whole. Also in many prior display panels of this type, once the panel is installed in the automobile, the connectors and their lamps are relatively inaccessible so that it is difficult and time consuming to replace a defective bulb. Therefore repair costs are higher than they need be.

SUMMARY OF THE INVENTION

The present invention aims to provide an improved electrical connector for lamps, switches and other electrical components.

Another object of the invention is to provide a low-cost electrical connector which is particularly suitable for use in automobile display panels.

A further object of the invention is to provide a low-cost electrical connector for removably retaining light bulbs, switches and other electrical components.

A further object of the invention is to provide an improved display panel for an automobile.

Another object of the invention is to provide a panel of this type which permits ready replacement of the bulbs therein.

Another object of the invention is to provide an illuminating display panel which is easy to fabricate and assemble.

A further object of the invention is to provide an illuminating display panel for an automobile which is composed of a relatively few different parts.

Other objects will, in part, be obvious and will, in part, appear hereinafter.

The invention accordingly comprises the features of construction, combination of elements and arrangement of parts as will be exemplified in the following detailed description, and the scope of the invention will be indicated in the claims.

Briefly, our electrical connector is especially suitable for use in a display panel for an automobile or the like to retain, and make electrical connections to, various lamps which, when energized, illuminate various legends on the panel face. Accordingly it will be described in that context. The display panel comprises a one piece housing composed of a pair of sections swingably connected together by a so-called living hinge. One housing section, namely the retainer section, retains a row of bulbs to which electrical connections are made as will be described presently. The other housing section, to wit: the cover section, defines an array of separate compartments. The front wall of the cover section comprises a translucent lens and the various legends are inscribed on that lens, each legend being centered on a separate compartment in that housing section.

When the two housing sections are swung together about their common hinge, the light bulbs supported by the retainer section project into the compartments defined in the cover section so that when a given bulb is energized, the associated compartment comprises a light box behind the lens which illuminates the particular legend in register with that compartment. Suitable integral latches are provided to lock the two housing sections together, the latches being releasable so that the housing can be opened in the event that it becomes necessary to replace a particular bulb therein.

As mentioned previously, the bulbs are releasably retained in the first section so that electrical connections are made between the car's electrical system and the bulbs. However, in the present panel, these functions are accomplished without using any metal stampings whatsoever. Rather, a row of the bulbs is retained in a slot arranged parallel to the row of compartments in the plastic cover section and having flexible and resilient side walls. The locations of the bulbs in the slot are aligned with the compartments in the housing cover section using appropriate detents. Bosses are formed in the slot side walls which interfit with grooves in the necks of the bulbs. When the bulbs are inserted into the slot, the slot side walls are spread apart to some extent until the bosses become aligned with the grooves in the bulb necks whereupon the slot side walls snap back to resiliently retain the bulbs in the slot.

Prior to inserting the bulbs, a flexible printed circuit is folded into the slot. The printed circuit is formed with a pair of printed circuit paths positioned on opposite sides of each bulb location in the slot. Each pair of printed circuit paths is arranged to contact a pair of terminals projecting from the neck of the bulb inserted at that slot location. Thus when all of the bulbs are positioned in the slot, separate electrical connections are made to the bulbs by way of the flexible printed circuit.

The other ends of the various conductive paths of the printed circuit lie in a parallel array at one edge margin of the circuit. That edge margin is retained on a wall of a receptacle in the panel housing which is arranged to receive a plug whose contacts make electrical contact with those circuit paths. That plug is, in turn, connected by a conventional electrical harness to the variuos switches and other components in the automobile's electrical system whose operation is to be monitored on the panel.

Thus the present display panel consists of only a one-piece molded plastic housing, a flexible printed circuit folded into the housing and a number of bulbs which are pluggable into the housing so as to make the proper electrical connections to the printed circuit therein. Due to its simplicity, then, the components of the display panel can be made accurately and reliably on a high volume production basis using automated machines. Furthermore, the printed circuit can be folded into the housing section of the panel and the bulbs plugged into place quite easily so that the panel can be assembled by relatively unskilled personnel, again, on a high volume basis. Consequently the overall cost of a display panel incorporating our improved electrical connectors should be considerably less than the cost of prior comparable panels of this general type.

Also the same connections can be used in other contexts to removably support, and make electrical connections to, switches, temperature sensors and other electrical components.

BRIEF DESCRIPTION OF THE DRAWINGS

For a fuller understanding of the nature and objects of the invention, reference should be had to the following detailed description, taken in connection with the accompanying drawings, in which:

FIG. 1 is a perspective view with parts cut away showing an automobile display panel embodying our invention, with the panel housing in its closed position;

FIG. 2 is a front elevational view of the FIG. 1 panel housing shown in its open position;

FIG. 3 is a sectional view along line 3—3 of FIG. 2 on a much larger scale;

DESCRIPTION OF THE PREFERRED EMBODIMENTS

Figure 4:
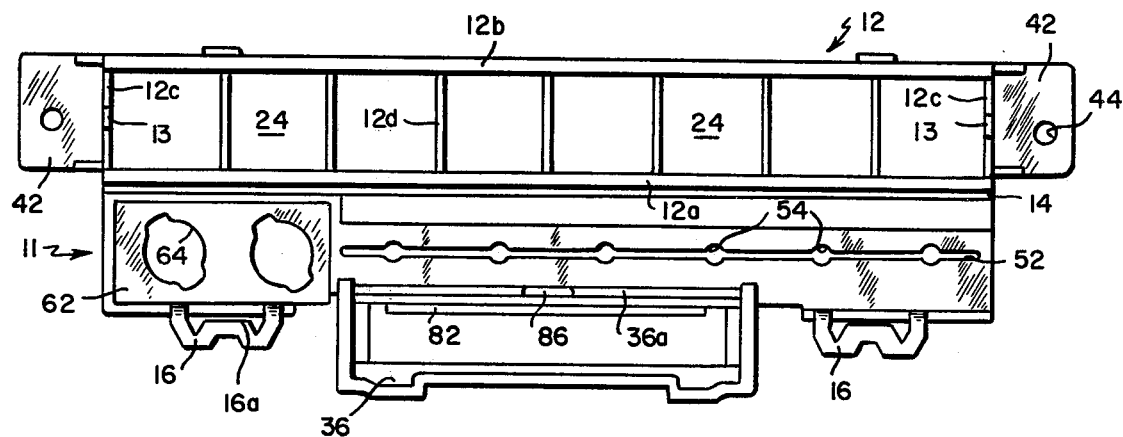
FIG. 4 is a rear elevational view of the panel housing shown in its open position.

Referring now to FIGS. 1 to 3 of the drawings, the subject panel includes a housing indicated generally at 10 composed of a generally rectangular retainer section 11 and a rectangular box-like cover section 12 having a top wall 12a, a bottom wall 12b and a pair of end walls 12c. The two housing sections are connected together by a so-called living hinge 14 which extends substantially the entire length of the housing. The two housing sections and the hinge 14 are all molded at one and the same time of a suitable impact resistant plastic such as ABS or nylon. The housing sections are withdrawn from the mold in their open position illustrated in FIGS. 2 and 3. They can be folded together about hinge 14 to a closed position shown in FIG. 1 and in dotted lines in FIG. 3.

Figure 7:
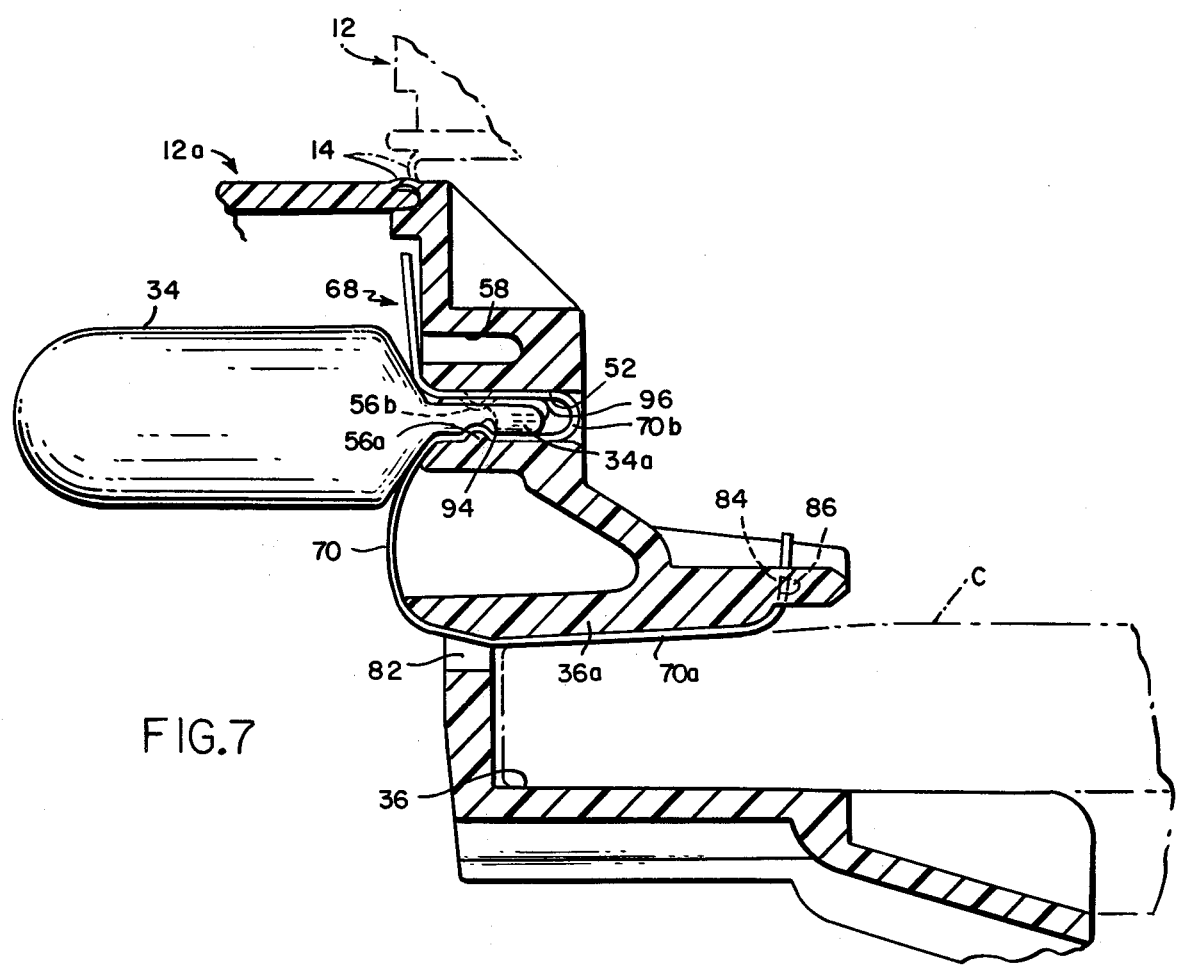
FIG. 7 is a fragmentary sectional view along line 7—7 of FIG. 6 on a still larger scale showing certain components of the panel in greater detail.

As best seen in FIGS. 3 and 7, the living hinge 14 is formed in the mold along with housing sections 11 and 12 so that the ends of the hinge are oriented approximately 45° at the points where those ends join the walls of the housing sections. In other words, when the housing is open which is its position in the mold, the hinge is bowed substantially uniformly in one direction along its length so that there are 45° angles between the hinge ends and the housing sections. Then, when the housing sections are closed together as shown in solid lines in FIG. 7, the hinge 14 flexes along its entire length so that it is bowed uniformly in the opposite direction, with its ends still making 45° angles with the housing sections. Therefore any stresses are distributed uniformly over the entire length of the hinge 14 rather than being concentrated at the center or ends of the hinge as is the case with conventional living hinges whose ends join the structures to be hinged together at 0° or 90° angles.

Still referring to FIG. 7, when the two housing sections are closed, the edge 12d of section 12 seats against an edge wall 11a of section 11 with a relatively snug fit so that there is some elongation of the hinge resulting in a tensional preload on the hinge side of the housing 12a. This ensures that the two sections are drawn tightly together all along their common hinge line thereby ensuring that the housing as a whole is tightly closed and structurally sound.

A pair of flexible resilient integral latches 16 are formed at the bottom edge of housing section 11 near the opposite ends thereof. These latches project out from that edge so that their free ends, which are notched at 16a, engage a pair of dogs 18 formed in the cover section wall 12b when that cover section is in its closed position. Thus as best seen in FIG. 3, when the cover section 12 is swung to its dotted line closed position, the notched end 16a of each latch snaps over the corresponding dog 18 thereby retaining the cover section in that closed position. Also as seen in that figure, the latches 16 are curved along their lengths so that if and when it becomes necessary to open the housing, pressure against the fronts of the latches causes them to elongate sufficiently to disengage their notched ends 16a from dogs 18 thereby permitting the cover section 12 to be swung up to its solid line position shown in FIG. 3.

Referring to FIGS. 1 and 2, the housing cover section 12 is formed with a series of vertical walls 12d which are spaced apart along the length of the cover section thereby defining a series of generally rectangular compartments 24 in the housing section. The front wall of the cover section is closed off by a translucent plastic lens 28 upon which is inscribed a lengthwise series of legends L which are in register with the compartments in the cover section. The lens 28 is held in place by a pair of flanges 32 formed at the forward edges of the cover section top and bottom walls 12a and 12b. The lens 28 is inserted endwise into the slot defined by the flanges 32 as best shown in FIG. 3.

The two cover section end walls 12c are formed with tabs 13 which project out sufficiently so that when the lens is in place, the edges of those two end walls are more or less even with the front face of the lens so that they inhibit lengthwise movement of the lens.

As best shown in FIG. 1, a bulb 34 is removably positioned in each compartment 24. When a particular bulb is energized, it illuminates the associated compartment so light is projected through the lens 28 thereby illuminating the particular legend L superimposed on that compartment, to the exclusion of the other legends. An electrical harness H containing various conductors leading to the switches and other electrical components whose functions are being monitored on the display panel terminates in a connector block C which plugs into a receptacle 36 formed integrally with housing section 11. The electrical current carried to connector C is coupled through the housing section 11 as will be described later to energize the various bulbs 34 at the appropriate times to signal the driver that something is wrong or that he has forgotten to do something such as release his handbrake or fasten his seatbelt.

A pair of ears 42 molded integrally with the housing cover section end walls 12c contain openings 44 for receiving suitable screws or bolts to facilitate securing the housing 10 to suitable support structure in or under the automobile dashboard.

Referring now to FIGS. 2 and 3 of the drawings, a lengthwise slot 52 is formed in housing section 11 which extends from adjacent one end of that section almost to the opposite end thereof, the slot passing entirely through the section and parallel to the row of compartments 24. Superimposed on the slot 52 is a row of holes 54 which are spaced along the slot, each hole being centered on a compartment 24 in cover section 12. In other words, at those spaced locations, a cylindrical groove is formed in the opposite walls of slot 52 so that those grooves together form a generally cylindrical passage through the housing section. Also formed integrally in the opposite side walls of slot 52 at opposite sides of each hole 54 are a pair of short horizontal ribs 56a and 56b which project out into slot 52 at opposite sides of each hole 54. As best seen in FIG. 3, the two ribs are more or less located at the same depth in the slot.

Still referring to FIGS. 2 and 3, a lengthwise series of long narrow slots 58 are formed at each side of slot 52, a pair of such slots being centered on opposite sides of each hole 54. As shown in FIG. 3, the slots 58 do not extend all the way through the housing section 11. Their purpose is simply to weaken the side walls of slot 52 adjacent each hole 54 so that those walls are somewhat flexible and resilient in the vicinity of those holes so that after being spread apart the walls will resume their unstressed positions.

The illustrated housing section 11 also includes an area 62 at the right hand end thereof in which are formed a pair of openings 64 which are arranged to receive a pair of standard bulb sockets (not shown). The bulbs in those sockets would then serve to illuminte the two right-hand legends L on the FIG. 1 panel. The reason for including them here is simply to show that the connectors of the present invention can be used in conjunction with conventional sockets in the same panel.

Figure 5:
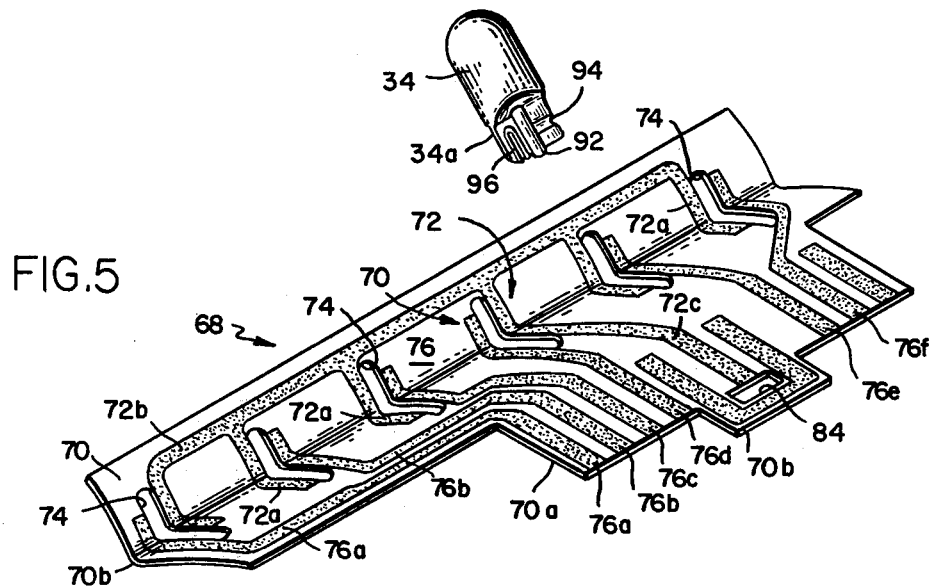
FIG. 5 is an exploded perspective view showing certain components of the FIG. 1 panel in greater detail.

Referring now to FIG. 5, the electrical connections from the connector block C (FIG. 1) to the individual bulbs 34 is made by way of a flexible printed circuit indicated generally at 68. Each circuit 68 comprises a flexible insulating plastic substrate 70 (e.g. 3 to 5 mil Mylar plastic) which carries a plurality of printed conductive paths 72 made of copper metal or the like. These paths may be formed using a standard etching or stamping process. A row of narrow vertical slots 74 are formed in substrate 70 at spaced-apart locations along its length. The number of slots 74 corresponds to the number of holes 54 (FIG. 2) in housing section 11. As seen from FIG. 5, there is a printed circuit path at opposite sides of each slot 74. Thus adjacent each slot is a short printed circuit path 72a which connects to a common electrical path 72b that extends substantially the entire length of the substrate. Path 72b connects with a leg 72c near the middle of the printed circuit which leg extends across a generally rectangular substrate extension 70a to the remote edge thereof. That printed circuit path 72a to 72c may be connected to electrical ground for example.

On the opposite side of each slot 74 is another electrical path. Thus adjacent the left-hand slot 74 is a printed path 76a which extends from that slot across the substrate 70 to the substrate extension 70a. Thereupon that path takes a right-hand turn and extends across extension 70a to the remote edge thereof. Another printed path 76b extends from a point just to the right of the next slot 74 across substrate 70 to substrate extension 70a. Thereupon the path 76b crosses that extension and terminates at a point just to the right of path 76a. A third path 76c extends from a point adjacent the third slot 74 to a location adjacent the end of path 76b, and so on. Thus as there are six slots 74, so there are six different paths 76a to 76f which begin adjacent one of those slots and end at the same remote edge of substrate extension 70a.

Figure 6:
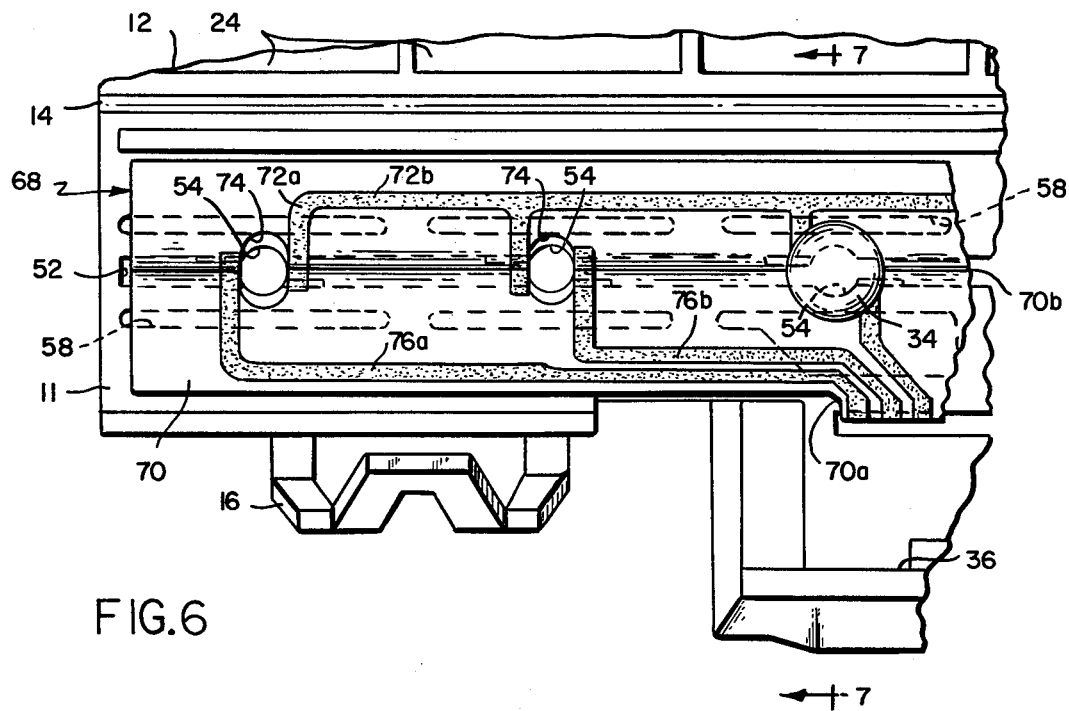
FIG. 6 is a fragmentary elevational view similar to FIG. 2 but on a larger scale showing the FIG. 5 components as installed in the panel housing.

Referring now to FIGS. 5 to 7, printed circuit 68 is folded lengthwise at 70b and inserted into slot 52 so that its slots 74 are centered on the holes 54 in housing section 11. The printed circuit is oriented in slot 52 so that the substrate extension 70a is facing the receptacle 36. A lengthwise slot 82 is formed in housing section 11 at the point where the receptacle 36 joins the remainder of housing section 11. The length of slot 82 is slightly longer than the width of substrate extension 70a so that the extension can be passed through that slot as best seen in FIG. 7. When that is done, the conductive paths spaced along the substrate extension are all positioned against the receptacle wall 36a. As seen in FIG. 7, the walls of the housing section 11 and receptacle 36 contacted by the circuit 68 are all smooth and rounded to avoid cutting the circuit. A loop 84 is formed in the end of the substrate extension 70a which is engaged over a tap 86 projecting up from the end of the receptacle wall 36a as best seen in FIGS. 4 and 7 to retain the substrate extension in place. Thus the conductive paths on that extension are arranged to be contacted by correspondingly positioned electrical contacts on the side of a connector block C when that is plugged into receptacle 36 as shown in FIGS. 1 and 7.

Referring now to FIG. 5, the bulb 34, which is a standard bulb, has a flat neck 34a which is more or less the same width as slot 52. A semicircular rib 92 is positioned on each side of the longitudinal axis of the bulb which ribs together form a cylindrical stem whose diameter is slightly less than the diameter of the holes 54 in housing section 11. Also a lateral groove 94 is formed in one face of neck 34a extending from the edge of the neck to the rib 92 on that face. A bulb terminal 96 in the form of a wire loop is positioned against that neck face on the opposite side of the same rib 92. An identical groove 94-terminal 96 pair is located on the opposite face of neck 34a but their positions on each side of the rib on that face are reversed. In other words, the pairs of grooves 94 and terminals 96 have reverse symmetry about the longitudinal axis of the bulb.

Referring to FIGS. 6 and 7, to install bulb 34 in panel 10, the bulb neck 34a is aligned with slot 52 and the bulb positioned over a hole 54 in housing section 11. The very visible printed circuit slots 74 help to center the bulb over the hole. Then the bulb is simply pushed down into the folded printed circuit 68. The bulb neck spreads apart the slot 52 walls to some extent, those walls being resilient due to the presence of the slots 58 on opposite sides of the bulb-receiving slot 52. As the bulb seats in the slot 52, its grooves 94 register with the ribs 56a and 56b in the slot walls. Whereupon the ribs snap into the grooves so that the bulb is resiliently retained in place. Thus only one plastic part is used to actually secure all of the bulbs. With each bulb in this position, its terminals 96 automatically contact the conductive paths of the printed circuit 68 which are located on opposite sides of the hole 54 which receives that bulb 34.

In this connection, it should be mentioned that the printed circuit 68 is flexible enough so that it more or less conforms to the ribs 56a and 56b as shown in FIG. 7. Therefore it does not interfere with the resilient engagement between the ribs and the bulb grooves 94. In fact, the thickness of the printed circuit between the bulb and the groove walls helps to ensure good electrical contact between the bulb terminals 96 and the conductive paths of the printed circuit in contact with those terminals. Thus with bulb 34 seated as shown in FIG. 7, a pair of electrical paths connect its terminals 96 to a pair of electrical contacts on the the connector block C plugged into receptacle 36. Consequently, the bulb 34 can be energized and thus illuminated by applying current to the bulb by way of the appropriate conductors in the electrical harness H (FIG. 1) leading to the connector block C.

It will be seen from the foregoing then that the present panel is easily assembled. First, the printed circuit 68 is folded into the slot 52 in open housing 10 and its loop 84 is engaged over tab 86. Then the bulbs 34 are pressed into place at the locations of the holes 54 in the housing section 11. Then the assembler slides the lens 28 into place between the flanges 32 on housing section 12 and closes the housing whereupon the latches 16 snap over the dogs 18 thereby retaining the housing in its closed position. Finally, after plugging the connector block C into receptacle 36, the panel can be mounted to suitable structure by inserting appropriate fasteners through the openings 44 in the housing ears 42 and securing them to that structure.

With the housing closed as aforesaid, there is no light leakage from the housing when the bulbs 34 are illuminated. Furthermore, there is no light leakage from one bulb compartment 24 to another because the rear edges of the compartment dividing walls 12d are pressed tightly against the front face of housing section 11 and the forward edges of those walls are in direct contact with the lens 28 which does not tend to transmit light along its thickness. Thus when a given bulb is energized to illuminate its compartment 24, only the legend L in register with that compartment is illuminated and made visible to the driver.

If it becomes necessary to replace a defective bulb, the latches 16 may be disengaged from dogs 18 by depressing them. This permits the housing connection 12 to be opened giving ready access to the defective bulb. Depending upon the location of the panel in the automobile, this may or may not involve detatching the panel 10 from its support structure in the automobile.

Figure 8:
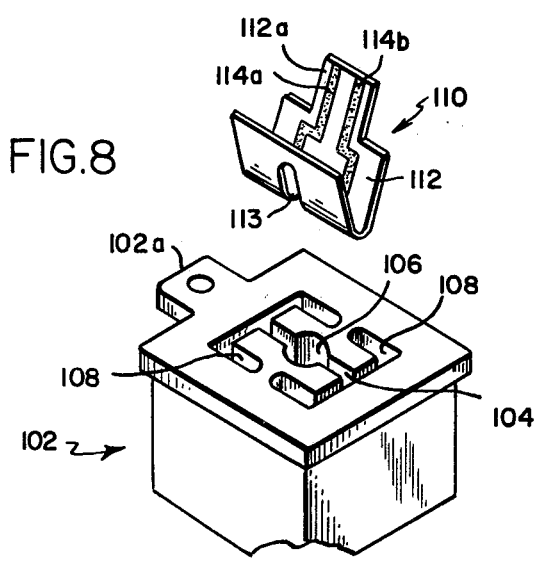
FIG. 8 is an exploded perspective view showing another embodiment of our invention.

The panel 10 discussed above comprises several connectors for removably retaining and making electrical connections to a plurality of bulbs 34. However, it is, of course, also possible to make a similar connector for a single bulb. In fact, that is quite desirable since there is a considerable saving in tooling costs over the conventional single lamp connectors employing metallic sockets to retain the bulb. A single lamp connector made in accordance with this invention is illustrated in FIG. 8. It comprises a generally rectangular molded plastic housing 102 formed with a mounting tab 102a. Housing 102 has a transverse slot 104. The side walls of slot 104 are vertically grooved at the middle of the slot to form a hole 106. Also additional slots 108 are provided at each side of slot 104 so that the slot walls are somewhat flexible and resilient. Preferably plastic material is removed at the ends of the slot walls where they join the side walls of the housing to permit even greater flexibility. Thus the connector illustrated in FIG. 8 is similar structurally to that portion of the housing section 11 at one bulb position. Indeed, the connector 102 retains one bulb 34 in the same manner as does housing section 11.

The FIG. 8 connector also includes a printed circuit indicated generally at 110 which comprises a flexible substrate 112 dimensioned so that it can be folded into the slot 104 in housing 102. A slot 113 is formed in the substrate and a pair of conductive paths 114a and 114b are printed on the substrate. These paths lead from locations on opposite sides of the slot 113 to the remote edge of an extension 112a of the printed circuit substrate. Thus the printed circuit 110 is simply a single-bulb version of the printed circuit 68 illustrated in FIG. 5. The printed circuit is folded into the slot 104 as described above. A bulb 34 is then pressed down into the folded printed circuit and the bulb is retained in the slot 104 in exactly the same way described above in connection with the multiple position connector. Appropriate electrical connections to the connector 102 are made by clipping terminals to the substrate extension 112a so that they separately contact the ends of the printed circuit paths thereon.

Figure 9:
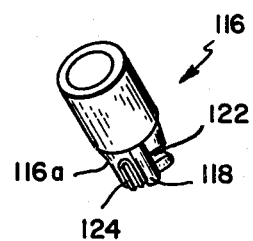
FIG. 9 is a similar view showing still another connector embodiment.

The present technique is also quite suitable for making electrical connections to electrical components other than bulbs. FIG. 9 illustrates a push-button switch 116 having a flat neck 116a which has more or less the same dimensions as the bulb neck 34a (FIG. 5). A pair of ribs 118 similar to ribs 92 are formed on opposite faces of neck 116a. Also a pair of lateral grooves 122 similar to grooves 94 are provided on the neck. Finally, the switch is provided with a pair of terminals 124 similar to terminals 96 which are electrically connected to the switch contacts. Thus the switch 116 can be plugged into the single position connector illustrated in FIG. 8 in lieu of a bulb 34. Such a connector-switch combination might be used for example in an automobile cruise control system to set the cruising speed.

It will be seen from the foregoing then that our display panel and connector constructions provide considerable savings in material cost, tooling cost and assembly cost yet they also result in products which are rugged and reliable and easily serviced in the event that a lamp or other electrical component connected in the panel has to be replaced. Accordingly, the panel and connector should find wide application, particularly in the automotive industry where large numbers of such display panels are required.

It will thus be seen that the objects set forth above among those made apparent from the preceding description are efficiently attained and since certain changes may be made in the above constructions without departing from the scope of the invention, it is intended that all matter contained in the description or shown in the accompanying drawings shall be interpreted as illustrative and not in a limiting sense.

It is also to be understood that the following claims are intended to cover all of the generic and specific features of the invention herein described.

What is claimed as new and desired to be secured by Letters Patent of the United States is:

1. An electrical connector comprising:
   A. a housing, said housing including:
      (1) a first section defining a pair of spaced-apart flexible, resilient walls with a slot between them;
      (2) a second section defining a row of compartments extending parallel to the slot;
      (3) a hinge between said housing sections allowing the two sections to be superimposed so that the compartments overlie the slot at spaced-apart locations therealong;
      (4) means for retaining the two sections in their superimposed condition; and
   B. a flexible printed circuit, said circuit including:
      (1) a flexible electrically insulating substrate, one dimension of the substrate being not appreciably greater than the length of the slot in the housing and another dimension of the substrate being greater than the depth of said slot so that the substrate can be folded into the housing slot so that at least one end portion of the substrate projects from the slot;
      (2) at least one pair of electrically isolated conductive paths secured to the substrate, corresponding first lengths of said paths being positioned at spaced-apart locations along the housing slot and corresponding second lengths of said paths being positioned on the substrate portion projecting from the slot.

2. The electrical connector defined in claim 1 and further including means on a housing wall defining a light bulb location between each said pair of first path lengths.

3. The electrical connector defined in claim 2 wherein each defining means includes a hole extending down into the slot.

4. The electrical connector defined in claim 3 wherein the defining means further includes at least one boss projecting out from a slot wall adjacent a said hole.

5. The electrical connector defined in claim 4 and further including a light bulb positioned in the slot at the location of a said hole, said bulb including A. a thin neck extending into the slot,
B. a generally cylindrical stem extending longitudinally along said neck projecting into a said hole,
C. at least one groove extending transversely across a face of the neck between said stem and the edge of said neck receiving a said boss, and
D. a pair of terminals on opposite sides of the neck contacting said pair of conductive paths.

6. The electrical connector defined in claim 5 and further including means for making separate electrical connections to said second path lengths to conduct electrical power to each bulb positioned in the slot.

7. The electrical connector defined in claim 6 wherein said connection making means comprises mating male and female connectors, one of which is formed in the housing and includes the second path lengths.

8. The connector defined in claim 1 wherein said first and second housing sections, said hinge and said retaining means are molded as a single unitary plastic piece.

9. An electrical connector comprising:
   A. a housing, said housing including:
      (1) a first section defining a pair of spaced-apart walls with a slot between them;
      (2) means defining a plurality of spaced-apart connector locations along the slot;
      (3) a second section having a front wall, top and bottom walls and a pair of end walls and a series of dividers spaced along its length parallel to the end walls which form a row of compartments, said housing sections being superimposed so that the front wall is positioned opposite the first housing section and the row of compartments extends parallel to the slot with each compartment being more or less centered on a connector; and
   B. a flexible printed circuit
      (1) folded into the slot; and
      (2) having a pair of conductive paths positioned in the slot at each said connector location, said paths extending out of the slot so that electrical connections can be made to them to provide electrical power to a light bulb or other electrical device positioned at each connector location and in electrical contact with said path pair at each said location.

10. The connector defined in claim 9 and further including means for removably retaining a bulb or other electrical device in the slot at each said location.

11. The electrical connector defined in claim 10 wherein
   A. the connector location defining means comprises a plurality of spaced-apart holes extending down into the slot, and
   B. the retaining means comprises at least one boss projecting out from a slot wall at one side of each said hole.

12. The electrical connector defined in claim 9 wherein the means defining each said connector location comprises a pair of ribs projecting out from the pair of walls into the slot, said ribs being parallel to the slot and spaced apart end to end.

13. The electrical connector defined in claim 12 and further including means defining a hole extending down into the slot between each pair of ribs.

14. The connector defined in claim 9 wherein the second housing section front wall positioned opposite the first housing section is light transmitting.

15. The connector defined in claim 9 and further including
   A. means for hinging the two housing sections together so that the second section can swing relative to the first from a closed position wherein it is superimposed on the first section to an open position which exposes the slot in the first section, and
   B. means for releasably retaining the second section in its said closed position.

16. The electrical connector defined in claim 15 wherein the two housing sections, the hinge means and the retaining means are all molded of plastic as a single unitary part.

17. The electrical connector defined in claim 16 wherein the hinge means is a so-called living hinge whose opposite ends extend out approximately 45° from the two housing sections when the second section is in its open position as when the unitary part is taken from its mold as well as when the second section is in its closed position.

18. The electrical connector defined in claim 9 and further including an electrical device positioned in the slot at each said location, said device having external terminals which electrically contact the printed circuit path pair at that location.

19. The electrical connector defined in claim 18 wherein the electrical device is one of a light bulb and switch.

20. An electrical connector comprising:
   A. a first housing section for releasably retaining an array of light bulbs at an array of connector locations, said section including a slot extending between said connector locations;
   B. a flexible printed circuit folded into the slot and adapted for making electrical connections to light bulbs at said connector locations, said circuit having pairs of connector paths, first lengths of which are adapted to contact a bulb at each of said connector locations and second lengths of which extend out of the slot for connection to a power source;
   C. a second housing section defining an array of compartments;
   D. means for hinging the two sections together so that the second section can swing relative to the first section from a closed position wherein the compartment array is superimposed on the array of connector locations in the first section to an open position wherein the two sections are swung apart so that said
   connector locations are all accessible; and
   E. means coacting between the two sections for removably retaining the second section in its said closed position.

21. The electrical connector defined in claim 20 wherein the two housing sections, the hinge means, and the coacting means are all molded out of plastic as a single unitary part.

22. The electrical connector defined in claim 21 wherein the hinge means is a so-called living hinge which bows substantially uniformly along its length in one direction when the second section is in it open position as when the unitary part is taken from its old and bows substantially uniformly in the opposite direction when the second section is in its closed position.

23. The connection defined in claim 22 wherein the hinge opposite ends join the two housing sections at an angle of about 45° when the second section is in its open and closed positions.

* * * * *